United States Patent
Lee (10) Patent No.: US 10,211,834 B1
(45) Date of Patent: Feb. 19, 2019

(54) LOW-VOLTAGE-DROP RECTIFIER CIRCUIT

(71) Applicant: Shanghai Zhaoxin Semiconductor Co., Ltd., Shanghai (CN)

(72) Inventor: Yeong-Sheng Lee, Fremont, CA (US)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 15/797,458

(22) Filed: Oct. 30, 2017

(51) Int. Cl.
| | | |
|---|---|---|
| H03K 19/018 | (2006.01) | |
| H03K 19/0185 | (2006.01) | |
| H03K 5/24 | (2006.01) | |
| H03K 17/687 | (2006.01) | |
| H02M 3/158 | (2006.01) | |
| H03K 19/20 | (2006.01) | |

(52) U.S. Cl.
CPC ... H03K 19/018521 (2013.01); H03K 5/2481 (2013.01); H03K 17/6872 (2013.01); H02M 3/158 (2013.01); H03K 19/20 (2013.01)

(58) Field of Classification Search
CPC ......... H03K 19/0185; H03K 19/01857; H03K 19/018514; H03K 19/00361; H03K 19/00346; H03K 19/00315; H03K 19/0013
See application file for complete search history.

(56) References Cited

U.S. PATENT DOCUMENTS

| | | | | |
|---|---|---|---|---|
| 4,590,396 A | * | 5/1986 | Koike | ............... G11C 7/22 |
| | | | | 257/E27.062 |
| 7,477,502 B1 | * | 1/2009 | Faulkner | ............. H02H 3/033 |
| | | | | 361/93.7 |

* cited by examiner

*Primary Examiner* — An T Luu
(74) *Attorney, Agent, or Firm* — McClure, Qualey & Rodack, LLP (57) ABSTRACT

A low-voltage-drop rectifier circuit includes a first MOSFET (Metal Oxide Semiconductor Field Effect Transistor), a second MOSFET, a comparator, and a level adjustment circuit. The first MOSFET has a gate terminal for receiving a control voltage, a source terminal connected to a connection node, a drain terminal connected to an input node, and a body terminal connected to the connection node. The second MOSFET has a gate terminal for receiving the control voltage, a source terminal connected to an output node, a drain terminal connected to the connection node, and a body terminal connected to the output node. The comparator generates a first comparison voltage and a second comparison voltage according to an input voltage at the input node and an output voltage at the output node. The level adjustment circuit generates and fine-tunes the control voltage according to the first comparison voltage and the second comparison voltage.

8 Claims, 7 Drawing Sheets

LOW-VOLTAGE-DROP RECTIFIER CIRCUIT

BACKGROUND OF THE INVENTION

Field of the Invention

The disclosure generally relates to a low-voltage-drop rectifier circuit, and more specifically, to a low-voltage-drop rectifier circuit used as a Schottky diode.

Description of the Related Art

The Schottky diode, named after German physicist Walter Schottky, is popularly used in power circuits. A traditional diode has a semiconductor-to-semiconductor junction, and its forward bias voltage is about 0.6V to 0.7V. In comparison, a Schottky diode has a metal-to-semiconductor junction, and its forward bias voltage is merely about 0.1V to 0.2V. The characteristics of the Schottky diode are more similar to those of an ideal diode than a traditional diode.

However, the Schottky diode is not available using a general CMOS (Complementary Metal Oxide Semiconductor) manufacturing process. If a Schottky diode is implemented with a discrete component, it will occupy a large layout area on a PCB (Printed Circuit Board). Accordingly, there is a need to propose a solution for solving the problems of the prior art.

BRIEF SUMMARY OF THE INVENTION

In a preferred embodiment, the invention is directed to a low-voltage-drop rectifier circuit with an input node and an output node, including: a first MOSFET (Metal Oxide Semiconductor Field Effect Transistor), wherein the first MOSFET has a gate terminal for receiving a control voltage, a source terminal connected to a connection node, a drain terminal coupled to the input node, and a body terminal connected to the connection node, and wherein the input node is arranged for receiving an input voltage; a second MOSFET, wherein the second MOSFET has a gate terminal for receiving the control voltage, a source terminal coupled to the output node, a drain terminal connected to the connection node, and a body terminal connected to the output node, and wherein the output node is arranged for outputting an output voltage; a comparator, comparing the input voltage with the output voltage, so as to generate a first comparison voltage and a second comparison voltage; and a level adjustment circuit, generating and fine-tuning the control voltage according to the first comparison voltage and the second comparison voltage, wherein when the first MOSFET and the second MOSFET are both turned on, the output voltage is equal to the input voltage minus a voltage drop substantially between 0.1V and 0.2V.

In some embodiments, the comparator includes: a differential amplifier, wherein the differential amplifier has a first input terminal for receiving the input voltage, a second input terminal for receiving the output voltage, an output terminal coupled to a second node, and wherein a first supply voltage provides an operation voltage of the differential amplifier; a current source, supplying a current to a fourth node; a fifth transistor, wherein the fifth transistor has a control terminal coupled to the fourth node, a first terminal coupled to a ground voltage, and a second terminal coupled to the fourth node; a seventh transistor, wherein the seventh transistor has a control terminal coupled to the second node, a first terminal coupled to the first supply voltage, and a second terminal coupled to a first comparison node, and wherein the first comparison node is arranged for outputting the first comparison voltage; an eighth transistor, wherein the eighth transistor has a control terminal coupled to the fourth node, a first terminal coupled to the ground voltage, and a second terminal coupled to the first comparison node; a ninth transistor, wherein the ninth transistor has a control terminal coupled to the first comparison node, a first terminal coupled to the first supply voltage, and a second terminal coupled to a second comparison node, and wherein the second comparison node is arranged for outputting the second comparison voltage; and a tenth transistor, wherein the tenth transistor has a control terminal coupled to the first comparison node, a first terminal coupled to the ground voltage, and a second terminal coupled to the second comparison node.

In some embodiments, the differential amplifier includes: a first transistor, wherein the first transistor has a control terminal coupled to a first node, a first terminal coupled to the first supply voltage, and a second terminal coupled to the first node; a second transistor, wherein the second transistor has a control terminal coupled to the first node, a first terminal coupled to the first supply voltage, and a second terminal serving as the output terminal of the differential amplifier; a third transistor, wherein the third transistor has a control terminal serving as the first input terminal of the differential amplifier, a first terminal coupled to a third node, and a second terminal coupled to the first node; a fourth transistor, wherein the fourth transistor has a control terminal serving as the second input terminal of the differential amplifier, a first terminal coupled to the third node, and a second terminal coupled to the output terminal of the differential amplifier; and a sixth transistor, wherein the sixth transistor has a control terminal coupled to the fourth node, a first terminal coupled to the ground voltage, and a second terminal coupled to the third node.

In some embodiments, the first supply voltage is generated according to the output voltage.

In some embodiments, the level adjustment circuit includes: an eleventh transistor, wherein the eleventh transistor has a control terminal coupled to a first control node, a first terminal coupled to a second supply voltage, and a second terminal coupled to a second control node, wherein the first control node is arranged for outputting the control voltage; a twelfth transistor, wherein the twelfth transistor has a control terminal coupled to the second control node, a first terminal coupled to the second supply voltage, and a second terminal coupled to the first control node; a thirteenth transistor, wherein the thirteenth transistor has a control terminal for receiving a first tuning voltage, a first terminal coupled to a ground voltage, and a second terminal coupled to the second control node; a fourteenth transistor, wherein the fourteenth transistor has a control terminal for receiving a second tuning voltage, a first terminal coupled to the ground voltage, and a second terminal coupled to the first control node; a fifteenth transistor, wherein the fifteenth transistor has a control terminal coupled to the second control node, a first terminal coupled to the second supply voltage, and a second terminal coupled to the second control node; and a sixteenth transistor, wherein the sixteenth transistor has a control terminal coupled to the first control node, a first terminal coupled to the second supply voltage, and a second terminal coupled to the first control node, wherein the first tuning voltage and the second tuning voltage are determined according to the first comparison voltage and the second comparison voltage.

In some embodiments, the second supply voltage is the output voltage.

In some embodiments, the first tuning voltage is equivalent to the first comparison voltage, and the second tuning voltage is equivalent to the second comparison voltage.

In some embodiments, the level adjustment circuit further includes a pre-control circuit which includes: a power good circuit, generating a power good voltage, wherein the power good voltage is kept at a relatively high voltage level; an OR gate, wherein the OR gate has a first input terminal for receiving the first comparison voltage, a second input terminal for receiving the inverse of the power good voltage, and an output terminal for outputting the first tuning voltage; and an AND gate, wherein the AND gate has a first input terminal for receiving the power good voltage, a second input terminal for receiving the second comparison voltage, and an output terminal for outputting the second tuning voltage.

In another preferred embodiment, the invention is directed to a power switch circuit, including: a first diode, wherein the first diode has an anode coupled to an external voltage, and a cathode coupled to a second supply voltage; a second diode, wherein the second diode has an anode coupled to an internal battery voltage, and a cathode coupled to the second supply voltage; a regulator, converting the second supply voltage into a first supply voltage; and a standby circuit, supplied by the first supply voltage, wherein the first supply voltage substantially remains at the same voltage level when the external voltage is either on or off, wherein at least one of the first diode and the second diode is the low-voltage-drop rectifier circuit as claimed in claim 1, and wherein the input node of the low-voltage-drop rectifier circuit acts as the anode and the output node of the low-voltage-drop rectifier circuit acts as the cathode.

In some embodiments, the external voltage is substantially 3.3V, the internal battery voltage is substantially 2.5V, and the first supply voltage is substantially 1.8V.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
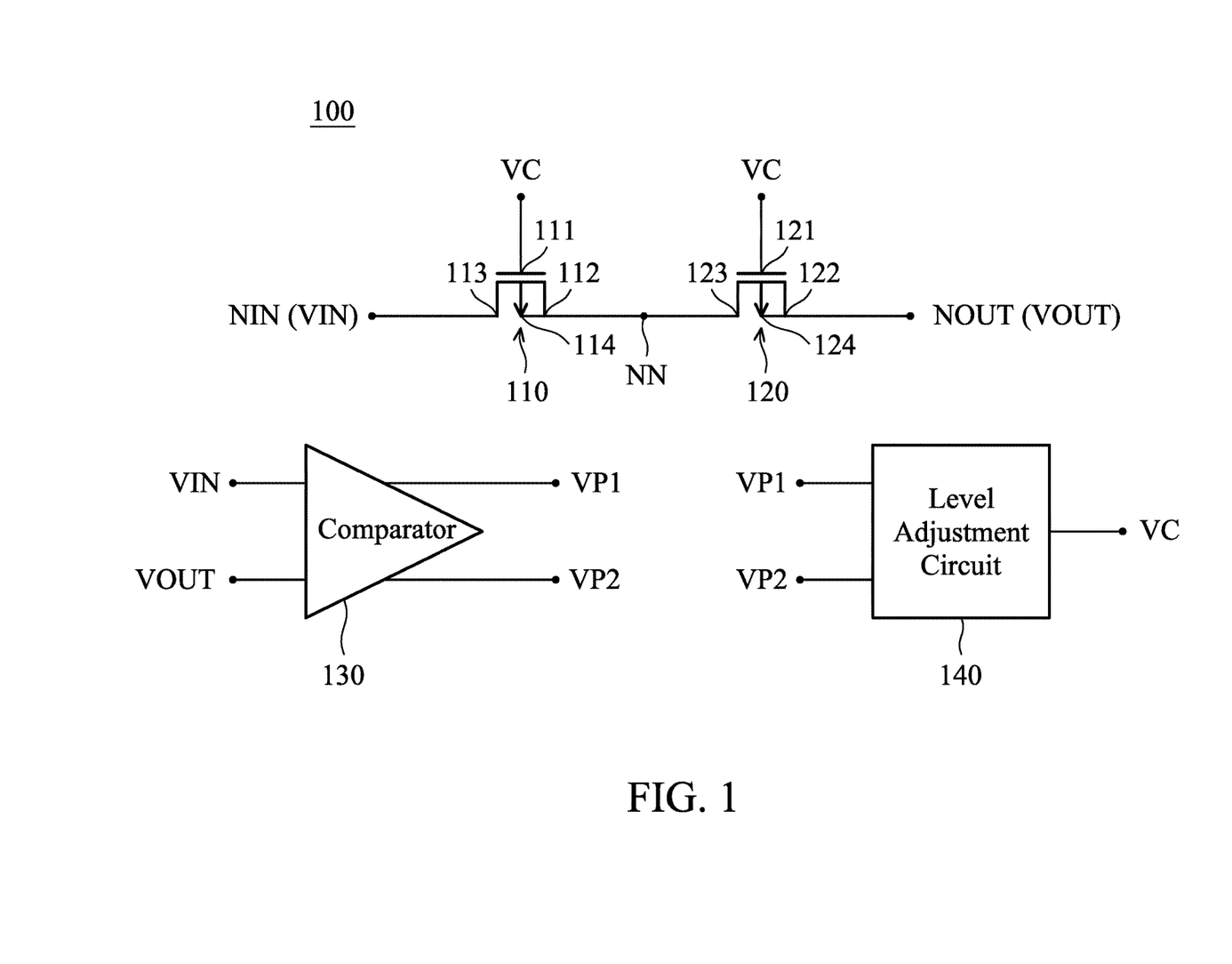
FIG. 1 is a diagram of a low-voltage-drop rectifier circuit according to an embodiment of the invention.

FIG. 1 is a diagram of a low-voltage-drop rectifier circuit 100 according to an embodiment of the invention. Generally, the low-voltage-drop rectifier circuit 100 has an input node NIN for receiving an input voltage VIN, and an output node NOUT for outputting an output voltage VOUT. As shown in FIG. 1, the low-voltage-drop rectifier circuit 100 includes a first MOSFET (Metal Oxide Semiconductor Field Effect Transistor) 110, a second MOSFET 120, a comparator 130, and a level adjustment circuit 140. For example, the first MOSFET 110 and the second MOSFET 120 may be PMOS transistors (P-type Metal Oxide Semiconductor Field Effect Transistors), but those skilled in the art may also use N-type MOSFETs with inverted voltage polarities. The first MOSFET 110 has a gate terminal 111 for receiving a control voltage VC, a source terminal 112 coupled to a connection node NN, a drain terminal 113 coupled to the input node NIN, and a body terminal 114 coupled to the connection node NN. That is, the body terminal 114 of the first MOSFET 110 is coupled to the source terminal 112 of the first MOSFET 110. The second MOSFET 120 has a gate terminal 121 for receiving the control voltage VC, a source terminal 122 coupled to the output node NOUT, a drain terminal 123 coupled to the connection node NN, and a body terminal 124 coupled to the output node NOUT. That is, the body terminal 124 of the second MOSFET 120 is coupled to the source terminal 122 of the second MOSFET 120. The comparator 130 compares the input voltage VIN with the output voltage VOUT, so as to generate a first comparison voltage VP1 and a second comparison voltage VP2. For example, the first comparison voltage VP1 and the second comparison voltage VP2 may have complementary logic levels. The level adjustment circuit 140 generates the control voltage VC and fine-tunes its voltage level according to the first comparison voltage VP1 and the second comparison voltage VP2, so as to control the voltage drop between the input node NIN and the output node NOUT, and to control the voltage differences between the gate and source/drain terminals of the MOSFETs (Vgs or Vgd). It should be noted that the low-voltage-drop rectifier circuit 100 may function as an equivalent Schottky diode implemented using a general CMOS (Complementary Metal Oxide Semiconductor) manufacturing process. The control voltage VC is arranged for turning on or off the first MOSFET 110 and the second MOSFET 120. If the control voltage VC has a relatively low logic level, the first MOSFET 110 and the second MOSFET 120 will be both turned on, and the output voltage VOUT will be equal to the input voltage VIN minus a very small voltage drop. For example, the very small voltage drop may be about 0.1V to 0.2V, which is considered as a cut-in voltage of the equivalent Schottky diode. Conversely, if the control voltage VC has a relatively high logic level, the first MOSFET 110 and the second MOSFET 120 will be both turned off. Therefore, depending on the control voltage VC, the first MOSFET 110 and the second MOSFET 120 may collectively act as a rectifier. In some embodiments, the drain terminal 113 and the body terminal 114 of the first MOSFET 110 form a first P-N junction diode, and the drain terminal 123 and the body terminal 124 of the second MOSFET 120 form a second P-N junction diode. Each of the first P-N junction diode and the second P-N junction diode may have a cut-in voltage equal to 0.7V, which is much larger than that of the equivalent Schottky diode.

The following embodiments will illustrate the circuits and operations of the low-voltage-drop rectifier circuit 100. It should be understood that these figures and descriptions are merely exemplary, rather than restricted limitations of the invention.

Figure 2:
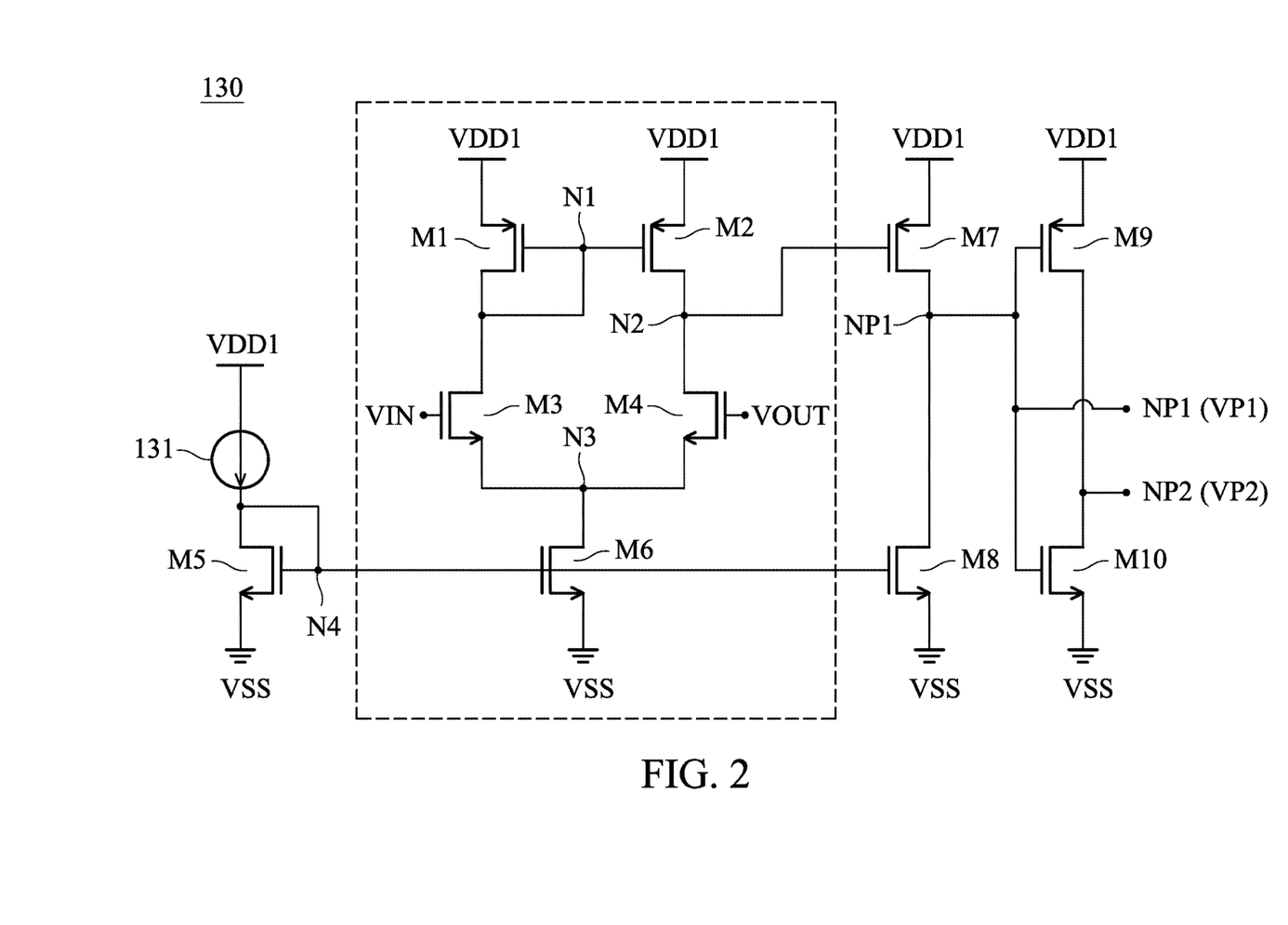
FIG. 2 is a diagram of a circuit structure of a comparator according to an embodiment of the invention.

FIG. 2 is a diagram of a circuit structure of the comparator 130 according to an embodiment of the invention. In the embodiment of FIG. 2, the comparator 130 includes a current source 131, a first transistor M1, a second transistor M2, a third transistor M3, a fourth transistor M4, a fifth transistor M5, a sixth transistor M6, a seventh transistor M7, an eighth transistor M8, a ninth transistor M9, and a tenth transistor M10. The first transistor M1, the second transistor M2, the seventh transistor M7, and the ninth transistor M9 may be PMOS transistors (P-type Metal Oxide Semiconductor Field Effect Transistors). The third transistor M3, the fourth transistor M4, the fifth transistor M5, the sixth transistor M6, the eighth transistor M8, and the tenth transistor M10 may be NMOS transistors (N-type Metal Oxide Semiconductor Field Effect Transistors).

The first transistor M1 has a control terminal coupled to a first node N1, a first terminal coupled to a first supply voltage VDD1, and a second terminal coupled to the first node N1. The second transistor M2 has a control terminal coupled to the first node N1, a first terminal coupled to the first supply voltage VDD1, and a second terminal coupled to a second node N2. The third transistor M3 has a control terminal for receiving the input voltage VIN, a first terminal coupled to a third node N3, and a second terminal coupled to the first node N1. The fourth transistor M4 has a control terminal for receiving the output voltage VOUT, a first terminal coupled to the third node N3, and a second terminal coupled to the second node N2. The fifth transistor M5 has a control terminal coupled to a fourth node N4, a first terminal coupled to a ground voltage VSS (e.g., 0V), and a second terminal coupled to the fourth node N4. The current source 131 supplies a current to the fourth node N4. The sixth transistor M6 has a control terminal coupled to the fourth node N4, a first terminal coupled to the ground voltage VSS, and a second terminal coupled to the third node N3. The seventh transistor M7 has a control terminal coupled to the second node N2, a first terminal coupled to the first supply voltage VDD1, and a second terminal coupled to a first comparison node NP1. The eighth transistor M8 has a control terminal coupled to the fourth node N4, a first terminal coupled to the ground voltage VSS, and a second terminal coupled to the first comparison node NP1. The ninth transistor M9 has a control terminal coupled to the first comparison node NP1, a first terminal coupled to the first supply voltage VDD1, and a second terminal coupled to a second comparison node NP2. The tenth transistor M10 has a control terminal coupled to the first comparison node NP1, a first terminal coupled to the ground voltage VSS, and a second terminal coupled to the second comparison node NP2. The first transistor M1, the second transistor M2, the third transistor M3, the fourth transistor M4, and the sixth transistor M6 form an differential amplifier, wherein the control terminal of the third transistor M3 serves as a first input terminal of the differential amplifier, the control terminal of the fourth transistor M4 serves as a second input terminal of the differential amplifier, the second node N2 serves as an output terminal of the differential amplifier, and the first supply voltage VDD1 provides the operation voltage of the differential amplifier. Those skilled in the art may use other circuit structures to implement the differential amplifier.

Generally, the comparator 130 compares the input voltage VIN with the output voltage VOUT, so as to output the first comparison voltage VP1 at the first comparison node NP1 and the second comparison voltage VP2 at the second comparison node NP2. For example, if the input voltage VIN is higher than the output voltage VOUT (analogous to the forward bias situation of a diode), the first comparison voltage VP1 will be equal to the ground voltage VSS, and the second comparison voltage VP2 will be equal to the first supply voltage VDD1; conversely, if the input voltage VIN is lower than the output voltage VOUT (analogous to the reverse bias situation of a diode), the first comparison voltage VP1 will be equal to the first supply voltage VDD1, and the second comparison voltage VP2 will be equal to the ground voltage VSS. The voltage levels of the first comparison voltage VP1 and the second comparison voltage VP2 may be further fine-tuned by the level adjustment circuit 140 for controlling the voltage drop between the input voltage VIN and the output voltage VOUT. In one embodiment, the output voltage VOUT may be lower than the input voltage VIN by about 0.1V to 0.2V when the input voltage VIN is higher than the output voltage VOUT (i.e., when the first MOSFET and the second MOSFET are both turned on), but the invention is not limited thereto.

Figure 3:
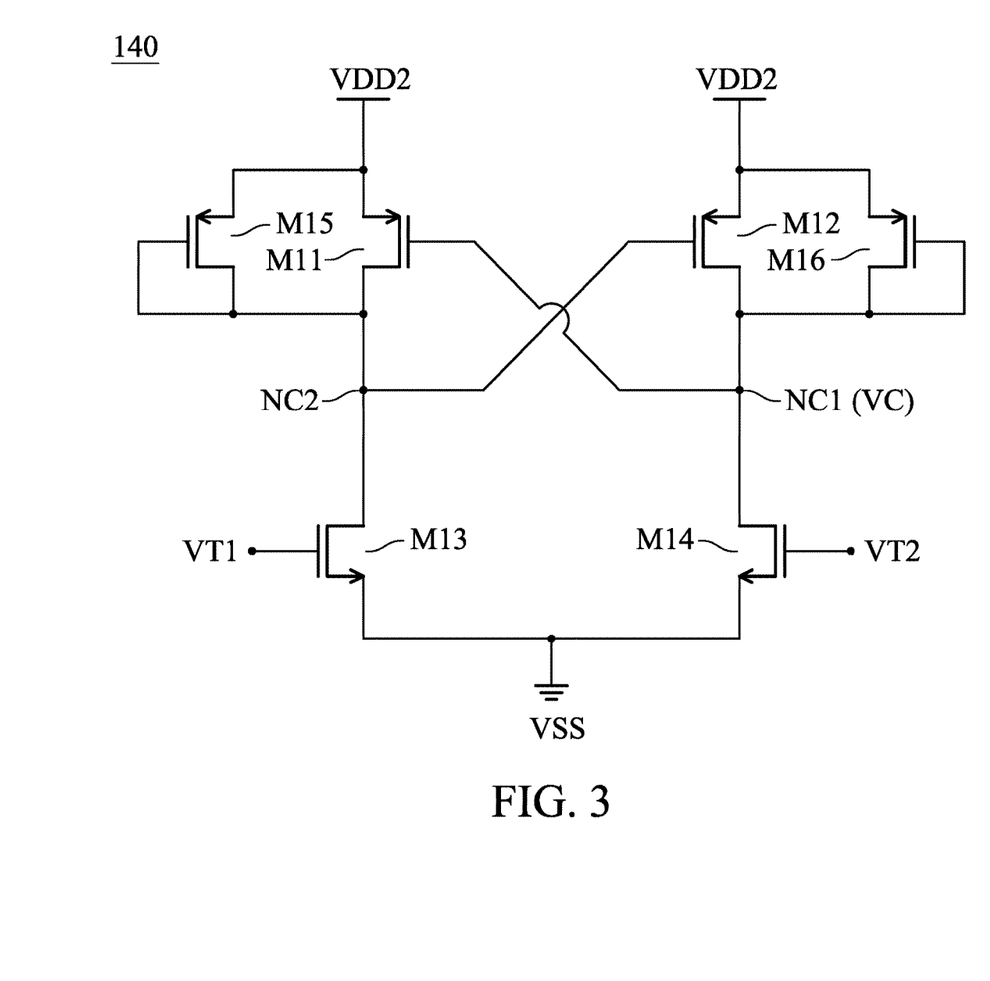
FIG. 3 is a diagram of a circuit structure of a level adjustment circuit according to an embodiment of the invention.

FIG. 3 is a diagram of a circuit structure of the level adjustment circuit 140 according to an embodiment of the invention. In the embodiment of FIG. 3, the level adjustment circuit 140 includes an eleventh transistor M11, a twelfth transistor M12, a thirteenth transistor M13, a fourteenth transistor M14, a fifteenth transistor M15, and a sixteenth transistor M16. The eleventh transistor M11, the twelfth transistor M12, the fifteenth transistor M15, and the sixteenth transistor M16 may be PMOS transistors (P-type Metal Oxide Semiconductor Field Effect Transistors). The thirteenth transistor M13 and the fourteenth transistor M14 may be NMOS transistors (N-type Metal Oxide Semiconductor Field Effect Transistors).

The eleventh transistor M11 has a control terminal coupled to a first control node NC1, a first terminal coupled to a second supply voltage VDD2, and a second terminal coupled to a second control node NC2. The twelfth transistor M12 has a control terminal coupled to the second control node NC2, a first terminal coupled to the second supply voltage VDD2, and a second terminal coupled to the first control node NC1. The thirteenth transistor M13 has a control terminal for receiving a first tuning voltage VT1, a first terminal coupled to the ground voltage VSS, and a second terminal coupled to the second control node NC2. The fourteenth transistor M14 has a control terminal for receiving a second tuning voltage VT2, a first terminal coupled to the ground voltage VSS, and a second terminal coupled to the first control node NC1. The fifteenth transistor M15 has a control terminal coupled to the second control node NC2, a first terminal coupled to the second supply voltage VDD2, and a second terminal coupled to the second control node NC2. The sixteenth transistor M16 has a control terminal coupled to the first control node NC1, a first terminal coupled to the second supply voltage VDD2, and a second terminal coupled to the first control node NC1.

The second supply voltage VDD2 of FIG. 3 may be higher than the first supply voltage VDD1 of FIG. 2. For example, the second supply voltage VDD2 may be about 3.1V, and the first supply voltage VDD1 may be 1.8V, but they are not limited thereto. Generally, the level adjustment circuit 140 compares the first tuning voltage VT1 with the second tuning voltage VT2, so as to output the control voltage VC at the first control node NC1. For example, if the first tuning voltage VT1 is higher than the second tuning voltage VT2, the control voltage VC will be pulled up to a relatively high voltage level; conversely, if the first tuning voltage VT1 is lower than the second tuning voltage VT2, the control voltage VC will be pulled down to a relatively low voltage level. By using the level adjustment circuit 140, the swing range of the control voltage VC is fine-tuned and is different from the swing range of each of the first tuning voltage VT1 and the second tuning voltage VT2. For example, each of the first tuning voltage VT1 and the second tuning voltage VT2 may have a relatively high voltage level equal to about 1.8V and a relatively low voltage level equal to about 0V, and the control voltage VC may have a relatively high voltage level equal to about 3V and a relatively low voltage level equal to about 1.5V, but they are not limited thereto.

It should be noted that the first tuning voltage VT1 and the second tuning voltage VT2 are determined according to the first comparison voltage VP1 and the second comparison voltage VP2. Specifically, the low-voltage-drop rectifier circuit 100 may be operated in either a static mode in one embodiment or a dynamic node in another embodiment. In the static mode, the first tuning voltage VT1 is equivalent to the first comparison voltage VP1, and the second tuning voltage VT2 is equivalent to the second comparison voltage VP2. In the dynamic mode, the level adjustment circuit 140 further includes a pre-control circuit 145 for generating the first tuning voltage VT1 and the second tuning voltage VT2 according to the first comparison voltage VP1 and the second comparison voltage VP2.

Figure 4:
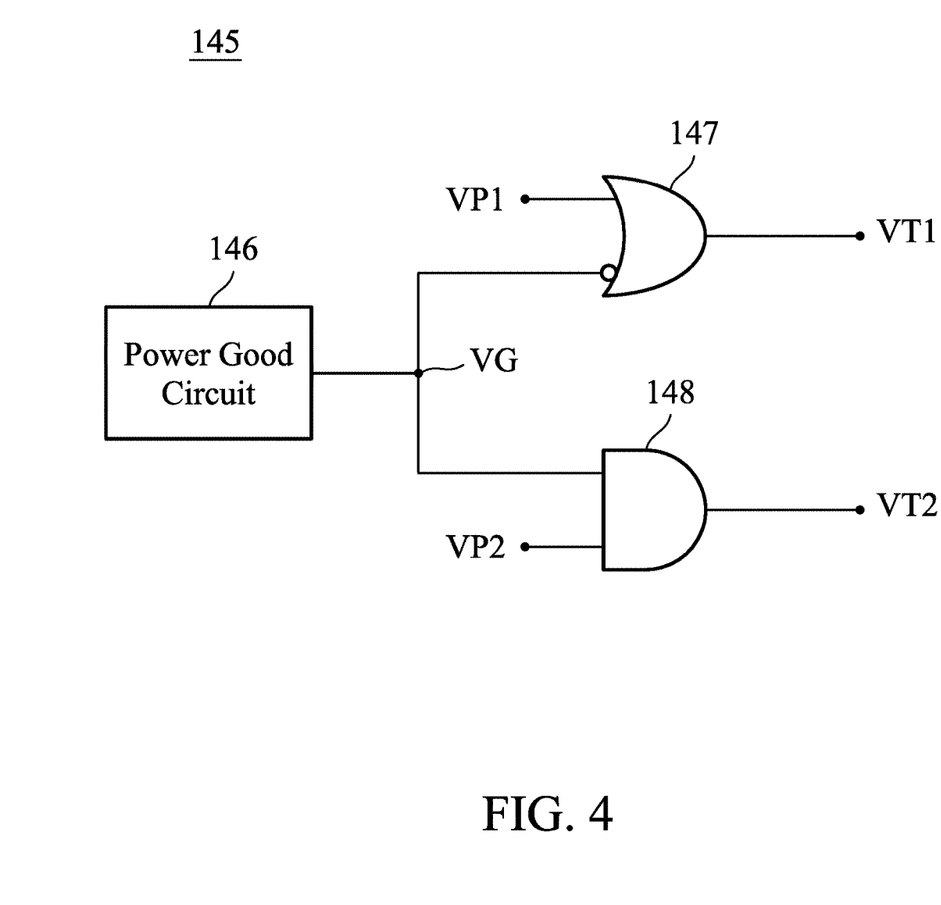
FIG. 4 is a diagram of a circuit structure of a pre-control circuit according to an embodiment of the invention.

FIG. 4 is a diagram of a circuit structure of the pre-control circuit 145 according to an embodiment of the invention. In the embodiment of FIG. 4, the pre-control circuit 145 includes a power good circuit 146, an OR gate 147, and an AND gate 148. The power good circuit 146 generates a power good voltage VG, which may have two opposite logic levels. For example, the power good voltage VG may have a relatively high voltage level equal to about 1.8V (corresponding to logic "1") and a relatively low voltage level equal to about 0V (corresponding to logic "0"), but they are not limited thereto. The OR gate 147 has a first input terminal for receiving the first comparison voltage VP1, a second input terminal for receiving the inverse of the power good voltage VG, and an output terminal for outputting the first tuning voltage VT1. The AND gate 148 has a first input terminal for receiving the power good voltage VG, a second input terminal for receiving the second comparison voltage VP2, and an output terminal for outputting the second tuning voltage VT2. The power good voltage VG may be determined according to some circuit parameters in an embodiment of the dynamic mode (described later). If the pre-control circuit 145 is used in an embodiment of the static mode, the power good voltage VG may be kept at its relatively high voltage level, such that the first tuning voltage VT1 will be the same as the first comparison voltage VP1, and the second tuning voltage VT2 will be the same as the second comparison voltage VP2. In another embodiment of the static mode, the pre-control circuit 145 may be omitted, and the first comparison voltage VP1 may directly serve as the first tuning voltage VT1 and the second comparison voltage VP2 may directly serve as the second tuning voltage VT2.

Figure 5:
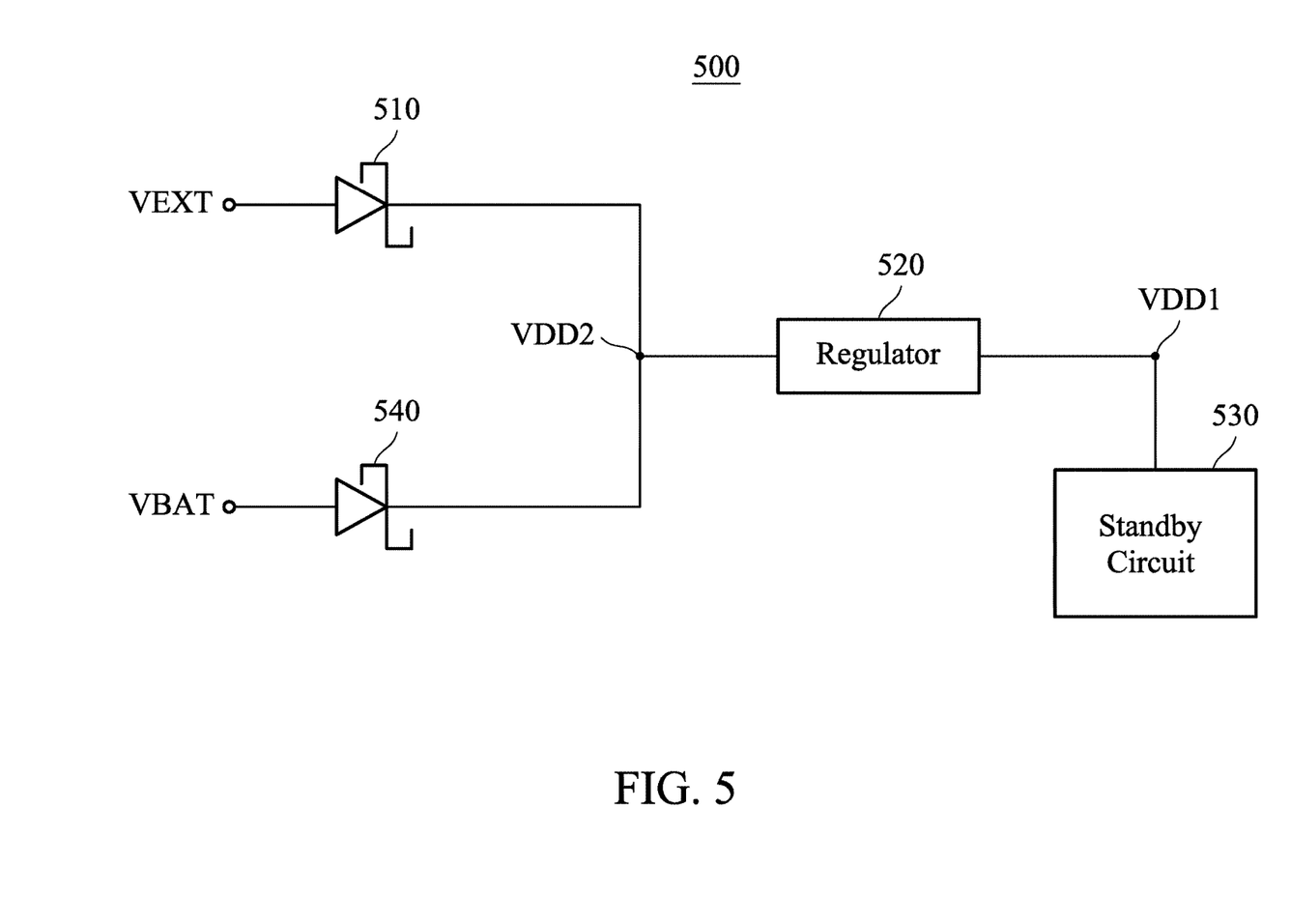
FIG. 5 is a diagram of a power switch circuit according to an embodiment of the invention.

FIG. 5 is a diagram of a power switch circuit 500 according to an embodiment of the invention. The embodiment of FIG. 5 describes the static mode application of the aforementioned low-voltage-drop rectifier circuit. As shown in FIG. 5, the power switch circuit 500 includes a diode 510, a diode 540, a regulator 520, and a standby circuit 530. For example, the power switch circuit 500 may be used in a PC (Personal Computer). An external voltage VEXT may be about 3.3V from an external power supply. An internal battery voltage VBAT may be about 2.5V from an internal battery disposed in the PC. The diode 510 may be a traditional P-N junction diode, a Schottky diode, or the low-voltage-drop rectifier circuit 100 (where the input node NIN acts as an anode and the output node NOUT acts as a cathode). The diode 510 has an anode coupled to the external voltage VEXT, and a cathode coupled to the second supply voltage VDD2. The diode 540 may be a traditional P-N junction diode, a Schottky diode, or the low-voltage-drop rectifier circuit 100 (where the input node NIN acts as an anode and the output node NOUT acts as a cathode). The diode 540 has an anode coupled to the internal battery voltage VBAT, and a cathode coupled to the second supply voltage VDD2. In one embodiment, at least one of the diode 510 and the diode 540 is implemented using the low-voltage-drop rectifier circuit 100. In another embodiment, the diode 540 is preferably implemented using the low-voltage-drop rectifier circuit 100 since the internal battery voltage VBAT is typically lower than the external voltage VEXT, and thus it is crucial to have lower voltage drop across the diode 540 Either the external voltage VEXT or the internal battery voltage VBAT provides electric power for the second supply voltage VDD2. For example, if the PC is powered on, the diode 510 will be turned on (i.e., forward biased), such that the second supply voltage VDD2 will get electric power from the external voltage VEXT, and the second supply voltage VDD2 will be equal to the external voltage VEXT minus a cut-in voltage (e.g., 0.1-0.2V or 0.7V depending on how the diode 510 is implemented) of the diode 510; conversely, if the PC is powered off, the diode 540 will be turned on (i.e., forward biased), such that the second supply voltage VDD2 will get electric power from the internal battery voltage VBAT, and the second supply voltage VDD2 will be equal to the internal battery voltage VBAT minus a cut-in voltage of the diode 540 (e.g., 0.1-0.2V or 0.7V depending on how the diode 540 is implemented). The regulator 520 converts the second supply voltage VDD2 into the first supply voltage VDD1. The first supply voltage VDD1 should be lower than the second supply voltage VDD2 due to the circuit resistance of the regulator 520. Typical regulator circuits are well known to those skilled in the art and are not described here. The standby circuit 530 is supplied by the first supply voltage VDD1. For example, the standby circuit 530 may be a RTC (Real Time Clock) circuit disposed in the PC.

If the low-voltage-drop rectifier circuit 100 of FIG. 1 is applied to the power switch circuit 500 for the diode 510, the diode 540, or the both, the comparator 130 will be supplied by the first supply voltage VDD1 (after the regulator 520), and the level adjustment circuit 140 will be supplied by the second supply voltage VDD2 (before the regulator 520). It should be noted that the internal battery voltage VBAT is generally lower than the external voltage VEXT. Accordingly, using the low-voltage-drop rectifier circuit 100 to implement the diode 540 can prevent the second supply voltage VDD2 from being too low to drive the regulator 520 when the PC is shut down and the external voltage VEXT becomes 0V. For example, if the diode 540 was implemented with a traditional diode having a cut-in voltage equal to 0.7V, the second supply voltage VDD2 would become about 1.8V (i.e., 2.5V−0.7V=1.8V) due to the shut-down operation of the PC; however, the first supply voltage VDD1 should be also about 1.8V, so the regulator 520 could not use the second supply voltage VDD2 to generate the first supply voltage VDD1 (to have no voltage drop in the regulator 520 is impossible). Furthermore, the level adjustment circuit 140 and the cascade of the first MOSFET 110 and the second MOSFET 120 can help to reduce the drain/source-to-gate voltage difference (Vgs or Vgd) of each MOSEFT to avoid gate oxide break-down in advanced CMOS (Complementary Metal-Oxide-Semiconductor) processes, which typically require Vgs and Vgd to remain below about 1.8V. For example, if the second MOSFET 120 were removed and the control voltage VC were the same as the first comparison voltage VP1, the drain-to-gate voltage difference of the first MOSFET 110 would reach about 2.5V (i.e., 2.5V−0V=2.5V) due to the shut-down operation of the PC; however, the first MOSFET 110 having the drain-to-gate voltage difference which is higher than 1.8V might be destroyed. The proposed design can prevent the first MOSFET 110 and the second MOSFET 120 from being overstressed and damaged.

Figure 6:
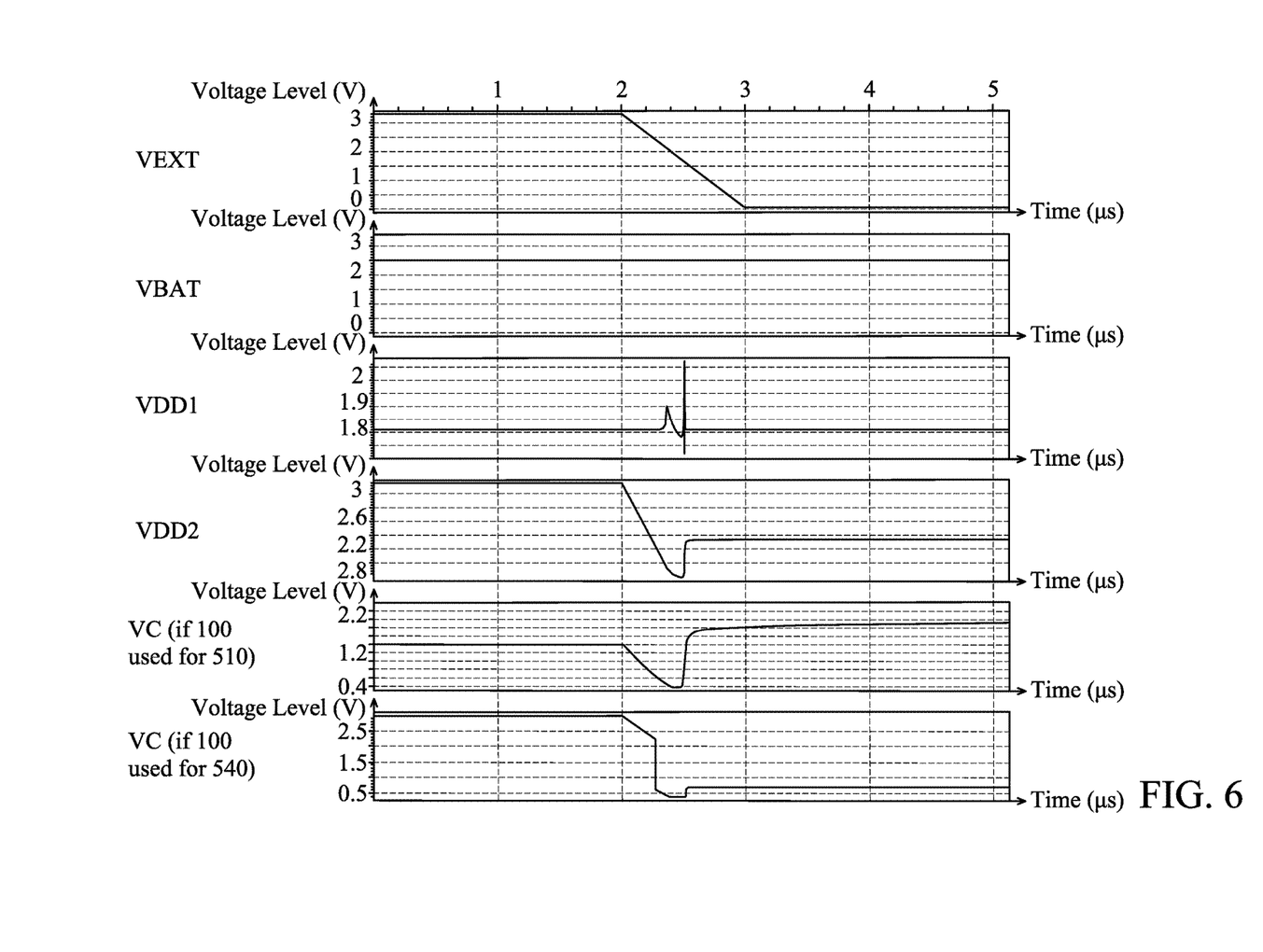
FIG. 6 is a diagram of signal waveforms relative to a power switch circuit according to an embodiment of the invention.

FIG. 6 is a diagram of signal waveforms relative to the power switch circuit 500 according to an embodiment of the invention. The horizontal represents time (μs), and the vertical axis represents the voltage level (V) of each signal. In one embodiment, if the low-voltage-drop rectifier circuit 100 is used to implement the diode 510, when the external voltage VEXT is on (e.g. 3.3V), the second supply voltage VDD2 is about 3.1V and the first supply voltage VDD1 is 1.8V, where the control voltage VC of the low-voltage-drop rectifier circuit 100 used to implement the diode 510 is about 1.5V to turn on the first MOSFET 110 and the second MOSFET 120, and it may be deduced that Vgs and Vgd of both the first MOSFET 110 and the second MOSFET 120 are kept below 1.8V. When the external voltage VEXT is off (e.g. 0V), the second supply voltage VDD2 is supplied by the internal battery voltage VBAT (e.g. 2.5V) and is about 2.3V, where the control voltage VC of the low-voltage-drop rectifier circuit 100 used to implement the diode 510 is about 3V (rising gradually in FIG. 6 and will eventually reach 3V) to turn off the first MOSFET 110 and the second MOSFET 120, and it may be deduced that Vgs and Vgd of both the first MOSFET 110 and the second MOSFET 120 are also kept below 1.8V. In another embodiment, if the low-voltage-drop rectifier circuit 100 is used to implement the diode 540, when the external voltage VEXT is on (e.g. 3.3V), the second supply voltage VDD2 is about 3.1V and the first supply voltage VDD1 is 1.8V, where the control voltage VC of the low-voltage-drop rectifier circuit 100 used to implement the diode 540 is about 3V to turn off the first MOSFET 110 and the second MOSFET 120, and it may be deduced that Vgs and Vgd of both the first MOSFET 110 and the second MOSFET 120 are kept below 1.8V. When the external voltage VEXT is off (e.g. 0V), the second supply voltage VDD2 is supplied by the internal battery voltage VBAT (e.g. 2.5V) and is about 2.3V, where the control voltage VC of the low-voltage-drop rectifier circuit 100 used to implement the diode 540 is about 0.7V to turn on the first MOSFET 110 and the second MOSFET 120, and it may be deduced that Vgs and Vgd of both the first MOSFET 110 and the second MOSFET 120 are also kept below 1.8V.

As shown in FIG. 6, the second supply voltage VDD2 initially gets electric power from the external voltage VEXT. Next, at the time point around 2 μs, the PC is shut down, and the external voltage VEXT becomes 0V, such that the second supply voltage VDD2 gets electric power from the internal battery voltage VBAT instead. The first supply voltage VDD1 is almost unchanged because of the regulator 520. The previously described changes of the control voltage VC of the low-voltage-drop rectifier circuit 100 used to implement the diode 510 and/or the diode 540 may be seen from the corresponding waveforms. Therefore, the second supply voltage VDD2 finally reaches the internal battery voltage VBAT minus a very small voltage drop of about 0.1V to 0.2V (i.e., the cut-in voltage of the low-voltage-drop rectifier circuit 100 functioning as an equivalent Schottky diode). Since the first supply voltage VDD1 and the second supply voltage VDD2 are always on (though the second supply voltage VDD2 may have different voltage levels), the low-voltage-drop rectifier circuit 100 always receive supply voltages regardless of the PC being on or off.

Figure 7:
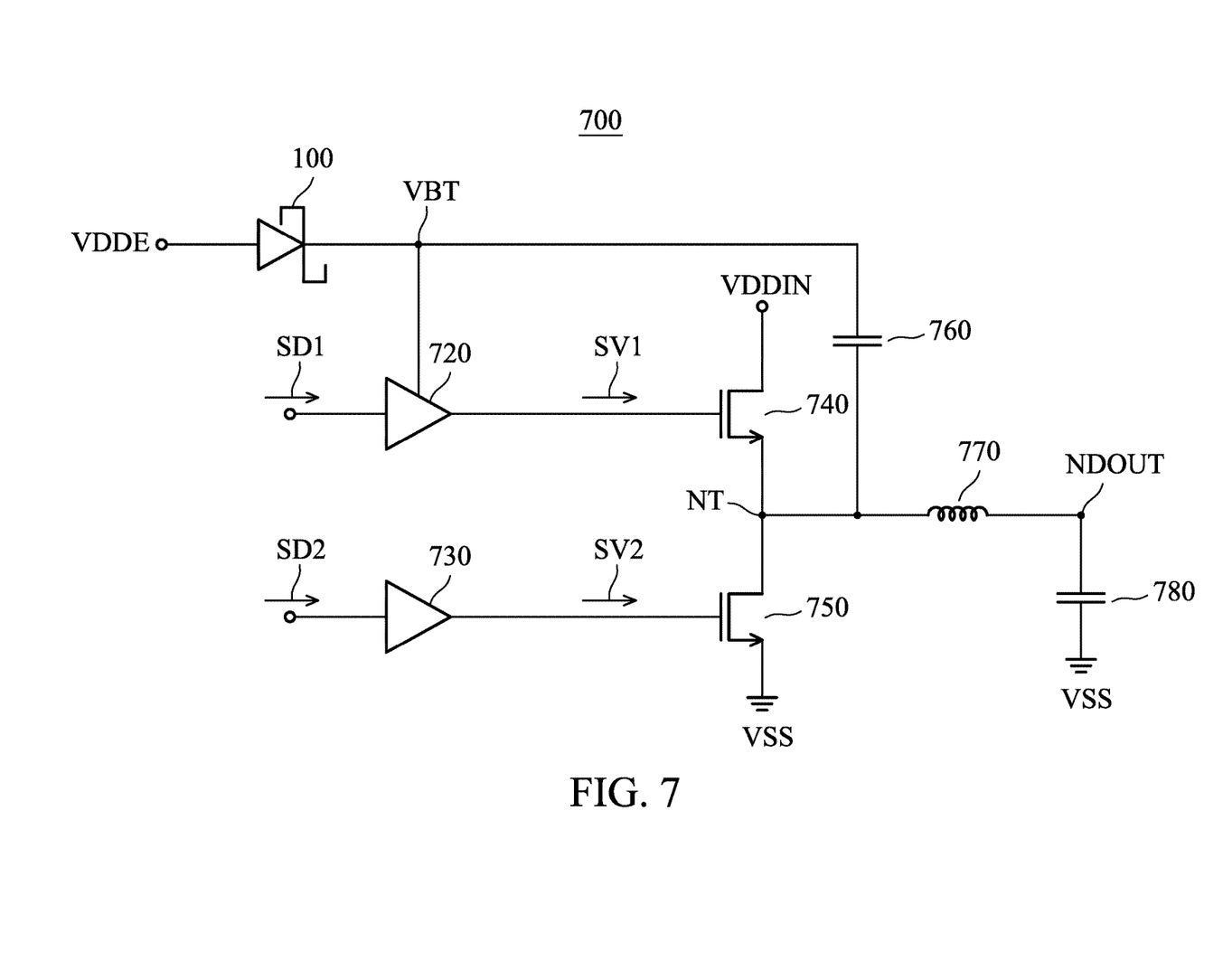
FIG. 7 is a diagram of a DC-to-DC (Direct Current to Direct Current) buck converter according to an embodiment of the invention.

FIG. 7 is a diagram of a DC-to-DC (Direct Current to Direct Current) buck converter 700 according to another embodiment of the invention. The embodiment of FIG. 7 describes the dynamic mode application of the aforementioned low-voltage-drop rectifier circuit. As shown in FIG. 7, the DC-to-DC buck converter 700 includes a low-voltage-drop rectifier circuit 100, a first driver 720, a second driver 730, a first driving transistor 740, a second driving transistor 750, a first capacitor 760, an inductor 770, and a second capacitor 780. The low-voltage-drop rectifier circuit 100 has an input node (NIN) coupled to an independent supply voltage VDDE, and an output node (NOUT) coupled to a boot voltage VBT. The first driver 720 is a high-side driver, and is supplied by the boot voltage VBT. The first driver 720 generates a first driving signal SV1 according to a first digital signal SD1. The second driver 730 is a low-side driver, and is supplied by a normal supply voltage (not shown), which may be the same or different from the independent supply voltage VDDE. The second driver 730 generates a second driving signal SV2 according to a second digital signal SD2. The first digital signal SD1 and the second digital signal SD2 may have complementary logic levels. The first driving transistor 740 and the second driving transistor 750 may be NMOS transistors (N-type Metal Oxide Semiconductor Field Effect Transistors). The first driving transistor 740 has a control terminal for receiving the first driving signal SV1, a first terminal coupled to a toggling node NT, and a second terminal coupled to an input supply voltage VDDIN. The second driving transistor 750 has a control terminal for receiving the second driving signal SV2, a first terminal coupled to the ground voltage VSS, and a second terminal coupled to the toggling node NT. The first capacitor 760 is coupled between the boot voltage VBT and the toggling node NT. The inductor 770 is coupled between the toggling node NT and a dynamic output node NDOUT. The second capacitor 780 is coupled between the dynamic output node NDOUT and the ground voltage VSS. For example, in the dynamic mode, the aforementioned power good circuit 146 may generate the power good voltage VG according to the voltage at the dynamic output node NDOUT, such as by comparing the voltage at the dynamic output node NDOUT with a desired voltage level to generate the comparison result as the power good voltage VG. The low-voltage-drop rectifier circuit 100 can help to reduce the voltage difference between the independent supply voltage VDDE and the boot voltage VBT. The proposed design can suppress the turned-on impedance of the first driving transistor 740, thereby enhancing the power efficiency of the DC-to-DC buck converter 700. It should be noted that in this embodiment, power MOSFET processes may be used to fabricate the low-voltage-drop rectifier circuit 100 so that there may be higher tolerances for the drain/source-to-gate voltage differences.

The invention provides a novel low-voltage-drop rectifier circuit, and a power switch circuit and a DC-to-DC buck converter with the same. In conclusion, the proposed design has at least the following advantages over the prior art: (1) suppressing the cut-in voltage of diodes in the circuitry, (2) being implemented using a general CMOS manufacturing process, (3) minimizing the total layout area of the circuitry, and (4) being more insensitive to the variations of PVT (Process, Voltage, and Temperature) variations.

Note that the above voltages, currents, resistances, inductances, capacitances and other element parameters are not limitations of the invention. A designer can adjust these parameters according to different requirements. The low-voltage-drop rectifier circuit, the power switch circuit, and the DC-to-DC buck converter of the invention are not limited to the configurations of FIGS. 1-7. The invention may merely include any one or more features of any one or more embodiments of FIGS. 1-7. In other words, not all of the features displayed in the figures should be implemented in the low-voltage-drop rectifier circuit, the power switch circuit, and the DC-to-DC buck converter of the invention. Although the embodiments of the invention use MOSFETs as examples, the invention is not limited thereto, and those skilled in the art may use other types of transistors such as BJT (Bipolar Junction Transistors), JFET (Junction Gate Field Effect Transistor), FinFET (Fin Field Effect Transistor), etc.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered exemplary only, with the true scope of the disclosed embodiments being indicated by the following claims and their equivalents.

What is claimed is:

1. A low-voltage-drop rectifier circuit with an input node and an output node, comprising:
    a first MOSFET (Metal Oxide Semiconductor Field Effect Transistor), wherein the first MOSFET has a gate terminal for receiving a control voltage, a source terminal connected to a connection node, a drain terminal coupled to the input node, and a body terminal connected to the connection node, and wherein the input node is arranged for receiving an input voltage;
    a second MOSFET, wherein the second MOSFET has a gate terminal for receiving the control voltage, a source terminal coupled to the output node, a drain terminal connected to the connection node, and a body terminal connected to the output node, and wherein the output node is arranged for outputting an output voltage;
    a comparator, comparing the input voltage with the output voltage, so as to generate a first comparison voltage and a second comparison voltage; and
    a level adjustment circuit, generating and fine-tuning the control voltage according to the first comparison voltage and the second comparison voltage,
    wherein when the first MOSFET and the second MOSFET are both turned on, the output voltage is equal to the input voltage minus a voltage drop substantially between 0.1V and 0.2V.

2. The low-voltage-drop rectifier circuit as claimed in claim 1, wherein the comparator comprises:
    a differential amplifier, wherein the differential amplifier has a first input terminal for receiving the input voltage, a second input terminal for receiving the output voltage, an output terminal coupled to a second node, and wherein a first supply voltage provides an operation voltage of the differential amplifier;
    a current source, supplying a current to a fourth node;
    a fifth transistor, wherein the fifth transistor has a control terminal coupled to the fourth node, a first terminal coupled to a ground voltage, and a second terminal coupled to the fourth node;
    a seventh transistor, wherein the seventh transistor has a control terminal coupled to the second node, a first terminal coupled to the first supply voltage, and a second terminal coupled to a first comparison node, and wherein the first comparison node is arranged for outputting the first comparison voltage;
    an eighth transistor, wherein the eighth transistor has a control terminal coupled to the fourth node, a first terminal coupled to the ground voltage, and a second terminal coupled to the first comparison node;
    a ninth transistor, wherein the ninth transistor has a control terminal coupled to the first comparison node, a first terminal coupled to the first supply voltage, and a second terminal coupled to a second comparison node, and wherein the second comparison node is arranged for outputting the second comparison voltage; and
    a tenth transistor, wherein the tenth transistor has a control terminal coupled to the first comparison node, a first terminal coupled to the ground voltage, and a second terminal coupled to the second comparison node.

3. The low-voltage-drop rectifier circuit as claimed in claim 2, wherein the differential amplifier comprises:
    a first transistor, wherein the first transistor has a control terminal coupled to a first node, a first terminal coupled to the first supply voltage, and a second terminal coupled to the first node;
    a second transistor, wherein the second transistor has a control terminal coupled to the first node, a first terminal coupled to the first supply voltage, and a second terminal serving as the output terminal of the differential amplifier;
    a third transistor, wherein the third transistor has a control terminal serving as the first input terminal of the differential amplifier, a first terminal coupled to a third node, and a second terminal coupled to the first node;
    a fourth transistor, wherein the fourth transistor has a control terminal serving as the second input terminal of the differential amplifier, a first terminal coupled to the third node, and a second terminal coupled to the output terminal of the differential amplifier; and a sixth transistor, wherein the sixth transistor has a control terminal coupled to the fourth node, a first terminal coupled to the ground voltage, and a second terminal coupled to the third node.

4. The low-voltage-drop rectifier circuit as claimed in claim 2, wherein the first supply voltage is generated according to the output voltage.

5. The low-voltage-drop rectifier circuit as claimed in claim 1, wherein the level adjustment circuit comprises:
   an eleventh transistor, wherein the eleventh transistor has a control terminal coupled to a first control node, a first terminal coupled to a second supply voltage, and a second terminal coupled to a second control node, wherein the first control node is arranged for outputting the control voltage;
   a twelfth transistor, wherein the twelfth transistor has a control terminal coupled to the second control node, a first terminal coupled to the second supply voltage, and a second terminal coupled to the first control node;
   a thirteenth transistor, wherein the thirteenth transistor has a control terminal for receiving a first tuning voltage, a first terminal coupled to a ground voltage, and a second terminal coupled to the second control node;
   a fourteenth transistor, wherein the fourteenth transistor has a control terminal for receiving a second tuning voltage, a first terminal coupled to the ground voltage, and a second terminal coupled to the first control node;
   a fifteenth transistor, wherein the fifteenth transistor has a control terminal coupled to the second control node, a first terminal coupled to the second supply voltage, and a second terminal coupled to the second control node; and
   a sixteenth transistor, wherein the sixteenth transistor has a control terminal coupled to the first control node, a first terminal coupled to the second supply voltage, and a second terminal coupled to the first control node,
   wherein the first tuning voltage and the second tuning voltage are determined according to the first comparison voltage and the second comparison voltage.

6. The low-voltage-drop rectifier circuit as claimed in claim 5, wherein the second supply voltage is the output voltage.

7. The low-voltage-drop rectifier circuit as claimed in claim 5, wherein the first tuning voltage is equivalent to the first comparison voltage, and the second tuning voltage is equivalent to the second comparison voltage.

8. The low-voltage-drop rectifier circuit as claimed in claim 5, wherein the level adjustment circuit further comprises a pre-control circuit which comprises:
   a power good circuit, generating a power good voltage, wherein the power good voltage is kept at a relatively high voltage level;
   an OR gate, wherein the OR gate has a first input terminal for receiving the first comparison voltage, a second input terminal for receiving the inverse of the power good voltage, and an output terminal for outputting the first tuning voltage; and
   an AND gate, wherein the AND gate has a first input terminal for receiving the power good voltage, a second input terminal for receiving the second comparison voltage, and an output terminal for outputting the second tuning voltage.

* * * * *